United States Patent
Salminen

(10) Patent No.: US 6,259,323 B1
(45) Date of Patent: Jul. 10, 2001

(54) GAIN CONTROL FOR LOW NOISE AMPLIFIER

(75) Inventor: Vesa-Matti Salminen, Oulu (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/466,425

(22) Filed: Dec. 17, 1999

(51) Int. Cl.[7] .................. H03G 3/10; H03F 3/62
(52) U.S. Cl. .................. 330/285; 330/279; 330/296; 330/297
(58) Field of Search .................. 330/51, 278, 279, 330/285, 296, 297

(56) References Cited

U.S. PATENT DOCUMENTS

| | | | |
|---|---|---|---|
| 3,140,408 | * 7/1964 | May | 307/885 |
| 4,041,409 | 8/1977 | Kominami et al. | 330/29 |
| 4,249,137 | 2/1981 | Malchow | 330/283 |
| 4,525,678 | 6/1985 | Lehmann et al. | 330/277 |
| 4,590,613 | 5/1986 | Tannery | 455/200 |
| 4,704,738 | 11/1987 | Graziadei et al. | 455/253 |
| 5,298,869 | 3/1994 | Jinich et al. | 330/286 |
| 5,570,064 | 10/1996 | Sugawara | 330/282 |
| 5,812,029 | 9/1998 | Prentice | 330/278 |
| 5,841,320 | 11/1998 | Ichihara | 330/133 |
| 5,889,432 | 3/1999 | Ho | 330/255 |
| 5,926,069 | 7/1999 | Ko et al. | 330/302 |
| 6,144,254 | * 11/2000 | Irvine et al. | 330/51 |

FOREIGN PATENT DOCUMENTS

9207711 * 11/1984 (JP) .................. 330/51

* cited by examiner

*Primary Examiner*—Michael B Shingleton
(74) *Attorney, Agent, or Firm*—Allen Scott Lineberry; Brian T. Rivers

(57) ABSTRACT

A gain control in an amplifier. The gain controller is an active amplifier device which provides high and low gain by switching DC biasing at the gain control terminals and also switching device terminal designations. In high gain mode, the DC voltage source is connected to a first bias terminal of the gain controller. The device terminal connected to said first bias terminal through a load is designated as the drain terminal. A constant current source is connected to a second bias terminal of the gain controller which is designated as the source terminal. In low gain mode, the constant current source is connected to the first bias terminal. Now the device terminal connected to the said first bias terminal through the load is redesignated as the source terminal. The DC voltage source is connected to the second bias terminal of the gain controller and the terminal is redesignated as the drain terminal.

36 Claims, 3 Drawing Sheets

GAIN CONTROL FOR LOW NOISE AMPLIFIER

FIELD OF THE INVENTION

This invention relates to amplifier gain controls and, more particularly, to active gain controls for low noise amplifiers.

BACKGROUND OF THE INVENTION

Various amplifier applications are known in which low noise and high linearity performance are required. Examples of such applications include low noise amplifiers (LNAs), variable gain amplifiers (VGAs), transmit/receive (T/R) modules, power amplifiers, transimpedance amplifiers, and optical receivers used in various products. Such products can include wireless communications, cellular telephony, fiber optic data links, portable electronics.

Many circuits, particularly communication system circuits, require devices for controlling signal level. Variable gain and automatic gain control amplifiers and attenuators are typically used for this purpose.

A problem in reception in mobile communication applications is that the strength of received electromagnetic waves varies over a broad range. In light of this problem, the receiver usually includes an AGC circuit. For the received signal strength indicator (RSSI) to work properly the gain levels must be accurately defined.

A typical conventional variable gain low noise amplifier is implemented utilizing a dual gate MOS FET (Metal Oxide Semiconductor Field Effect Transistor) as a transconductance amplifier. An input signal is applied to a first gate of the FET via an impedance matching circuit. The amplified signal is fed out from the FET via a matching circuit. A DC control voltage is applied to a second gate of the FET in order to determine the gain of the FET. However, in this type of amplifier, the gain control characteristics are non-linear. Additionally the signal gain linearity increase due to reduced gain is often insufficient.

In wireless products there is a need for multiband communications. That is, where the same wireless protocol can be used in varying parts of the RF spectrum. Presently, multi-band enabled wireless products require multiple LNAs (typically 1 per band). The typical LNA for a wireless product is implemented on Gallium-Arsenide (GaAs) integrated circuits (ICs). Multiple LNAs implemented in this manner require a relatively large amount of area on a radio frequency (RF) IC. The IC real estate required for implementation tends to exceed the specification for the implementation.

SUMMARY OF THE INVENTION

A method and system of gain control in an amplifier. Three modes of gain control are provided: high gain, low gain, and no gain. The gain controller is an active amplifier device which provides high and low gain by switching DC biasing at the gain control terminals and also switching device terminal designations. In high gain mode, the DC voltage source is connected to a first bias terminal of the gain controller. The device terminal connected to said first bias terminal through a load is designated as the drain terminal. A constant current source is connected to a second bias terminal of the gain controller which is designated as the source terminal. In high gain mode, the gain controller acts as a common-source, or transconductance, amplifier. In low gain mode, the constant current source is connected to the first bias terminal. Now the device terminal connected to the said first bias terminal through the load is redesignated as the source terminal. The DC voltage source is connected to the second bias terminal of the gain controller and the terminal is redesignated as the drain terminal. In low gain mode, the gain controller acts as a source-follower, or buffer, with no voltage gain. For automatic gain control, only DC level signals are switched, no switches are needed in the signal path. The method and apparatus can be implemented using discrete components, an integrated chip solution, or a combination of the two. In no gain mode the signal transistor is biased off and high attenuation is achieved.

The described gain controller provides several advantages. For example, a low noise amplifier with multiple modes of gain control can be designed wherein the gain controller utilizes only one high performance signal transistor. For another example, control of the gain does not require switches in the signal path. The absence of switches in the signal path can result in low noise operation of the amplifier. Moreover, the absence of switches in the signal path can also result in high linearity of amplification. For another example, the gain control can be designed using fewer components resulting in a less complex controller with no loss in gain control. For another example, the cost of the gain controller can be reduced because cheap DC-only switches can be used for the bias terminals. For another example, the lower component count that can be achieved in the presently preferred embodiment leads to a lower cost solution. For another example, the configuration of the presently disclosed innovations yields a well-controlled low gain mode with a high degree of linearity.

BRIEF DESCRIPTION OF THE DRAWINGS

The disclosed inventions will be described with reference to the accompanying drawings, which show important sample embodiments of the invention, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Various embodiments of the disclosed method and system will be described in the context of a low noise amplifier (or LNA). In the presently preferred embodiment, the disclosed innovations are implemented using a field effect transistor such as the NEC NE34018 as an active amplifier device.

Figure 1:
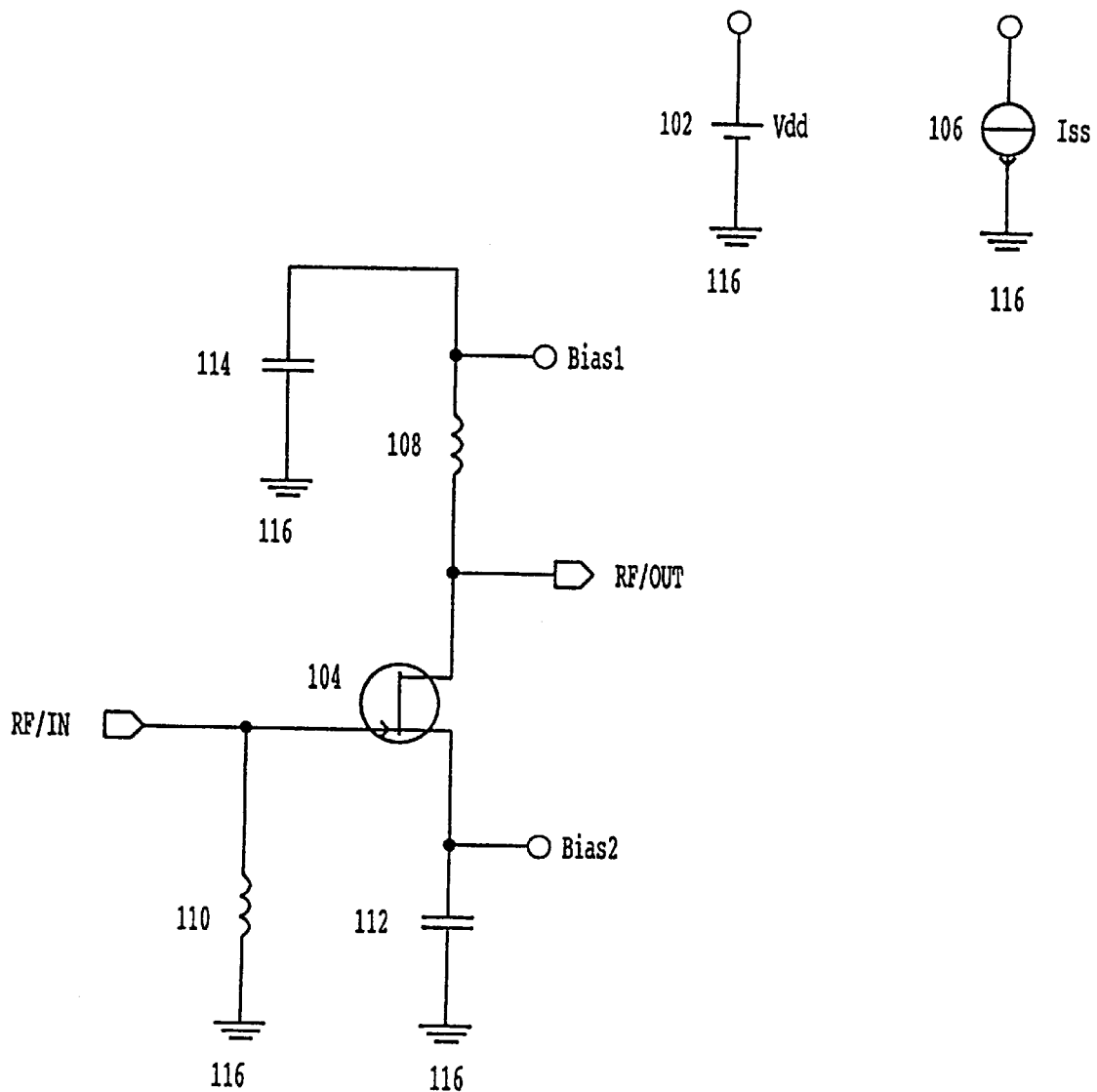
FIG. 1 depicts a low noise amplifier configuration according to the presently preferred embodiment.

FIG. 1 depicts a low noise amplifier configuration according to the presently preferred embodiment. The low noise amplifier of the presently preferred embodiment offers a choice of operation in three gain modes: high gain, low gain, and no gain. Gain is applied to an input signal RF/IN. In the presently preferred embodiment, the input signal RF/IN is connected to the control pin of the transistor 104.

In high gain mode, a DC voltage source, $V_{DD}$, 102 is connected to the Bias 1 terminal. In high gain mode, the RF/OUT terminal is designated as the drain terminal of the transistor 104. Also in high gain mode, a Constant Current Source, $I_{SS}$, 106 is connected to the Bias 2 terminal. In high gain mode, the Bias 2 terminal is designated as the source terminal of the transistor 104. Configured in this manner, the LNA acts in common-source (or transconductance) operation, that is, both voltage and current gain are provided by the LNA. An inductor 108 provides the load for the common-source operation. An inductor 110 is used to provide DC-bias to the gate. A capacitor 112 tied to (common reference) ground 116 AC-grounds the source for high signal gain and a capacitor 114 blocks any signal interference to the bias generator.

In low gain mode, the DC voltage source, $V_{DD}$, 102 is connected to the Bias 2 terminal and the Constant Current Source, $I_{SS}$, 106 is connected to the Bias 1 terminal. As a result of the inverse biasing, in low gain mode, the transistor 104 terminal designations are interchanged i.e., the terminal designated as the source terminal in high gain operation (Bias 2) is now redesignated as the drain terminal and vice versa. Configured in this manner, the LNA acts as a source-follower (or buffer), that is, current gain is provided by the LNA but voltage gain is not.

In no gain mode, the Bias 1 and Bias 2 terminals of transistor 104 are biased to the same potential. That is, the transistor 104 is biased off and high signal attenuation is achieved.

The connections to the active amplifier device of the presently preferred embodiment can be represented as follows:

|  | Bias 1 | Bias 2 |
|---|---|---|
| High Gain | $V_{DD}$ | $I_{SS}$ |
| Low Gain | $I_{SS}$ | $V_{DD}$ |

Figure 2:
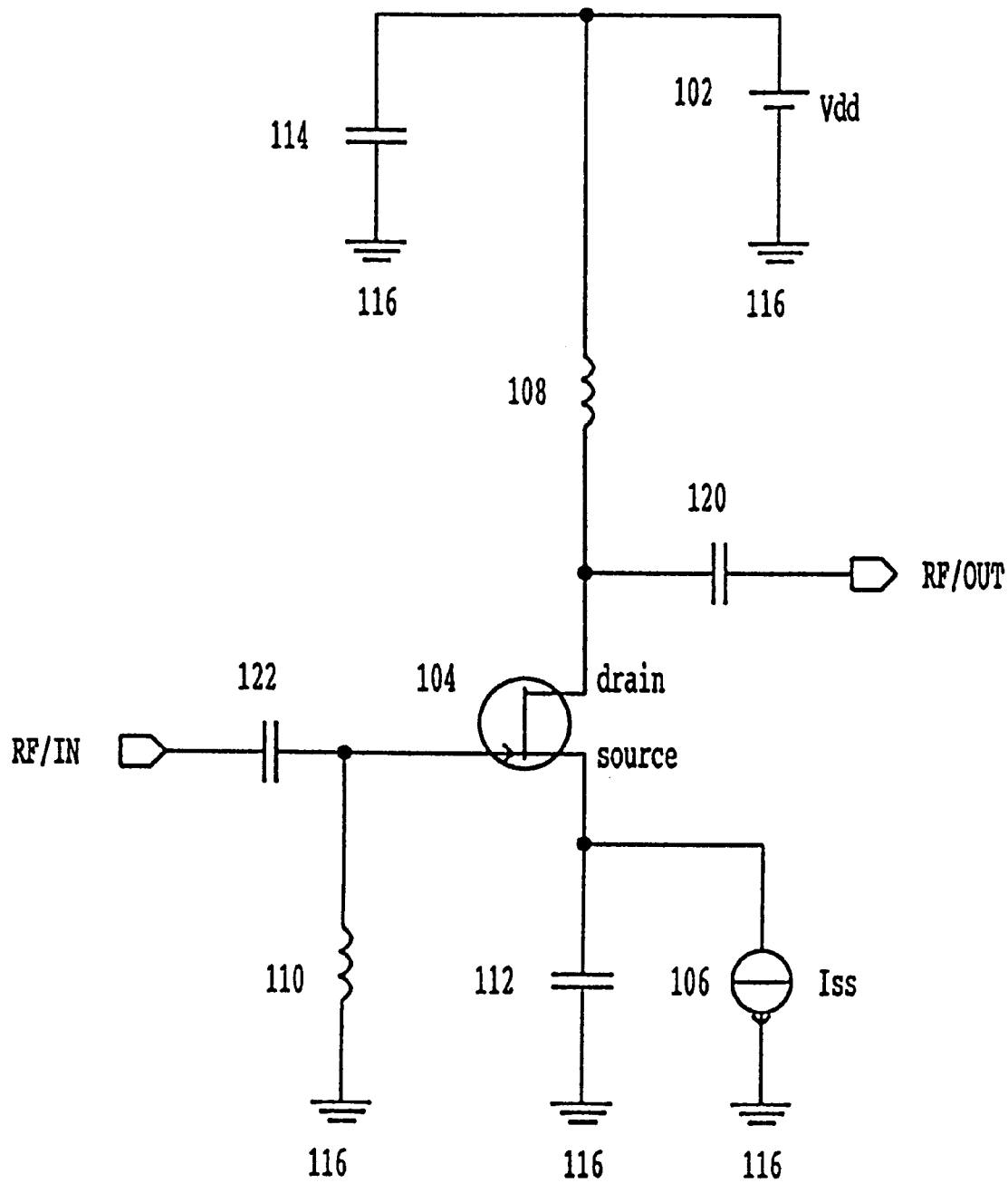
FIG. 2 depicts the configuration of the gain controller of the presently preferred embodiment in common-source operation (high gain mode).

FIG. 2 depicts the configuration of the gain controller of the presently preferred embodiment in common-source operation (high gain mode). The terminals of the active amplifier device 104 of the presently preferred embodiment are labeled according to their designations for the high gain mode of operation. The Bias 1 and Bias 2 connections of FIG. 1 are connected as described above for high gain mode. $V_{DD}$ is therefore connected to the drain terminal of the device 104 through a load inductor 108 and $I_{SS}$ is connected to the source terminal of the device 104. RF/IN provides the input signal and RF/OUT is the output signal. The capacitors 120 and 122 are added for DC-blocking and matching.

Figure 3:
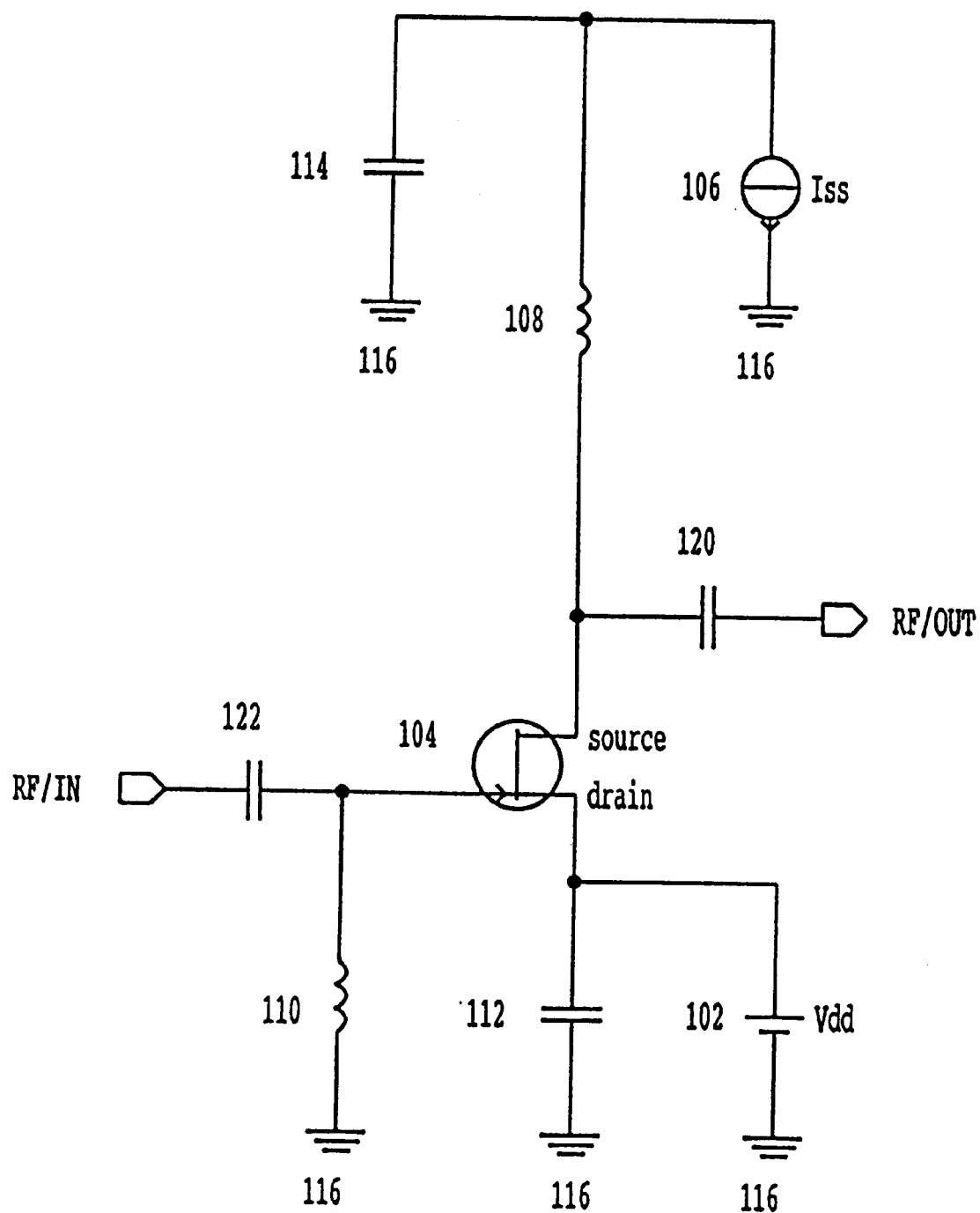
FIG. 3 depicts the configuration of the gain controller of the presently preferred embodiment in source-follower operation (low gain mode).

FIG. 3 depicts the configuration of the gain controller of the presently preferred embodiment in source-follower operation (low gain mode). The terminals of the active amplifier device of the presently preferred embodiment are labeled according to their designations for the low gain mode of operation. The Bias 1 and Bias 2 connections of FIG. 1 are as described above for low gain mode. $V_{DD}$ is therefore connected to the terminal now redesignated as the drain terminal of the device 104 and $I_{SS}$ is connected to the terminal now redesignated as the source of the device 104 through an inductor 108. RF/IN provides the input signal and RF/OUT is the output signal. The capacitors 120 and 122 are added for DC-blocking and matching.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, in the presently preferred embodiment, the disclosed innovations are implemented using a N-channel junction field effect transistor such as the NEC NE34018. However, other transistor configurations may alternatively be used, eg. BJT, HBT, HEMT, MESFET or MOSFET. Naturally all normal linearization, bandwidth limiting and matching circuit techniques can also be applied to the described embodiment. For example, the inductors utilized in the present embodiment could be replaced with resistors, active loads, or resonant circuits. For another example, current-voltage feedback linearization (ie. high gain mode source degeneration) could be also used.

For another example, if the disclosed innovations are implemented using another type of device, the types of operations performed by the innovations would be described differently. For example, if the disclosed innovations are implemented using a bi-polar device, the operation of the innovations would be described as common-emitter and emitter-follower instead of common-source and source-follower, respectively. For another example, the disclosed innovations have been described in the context of a low noise amplifier. However, the disclosed innovations may also be utilized in any type of amplifier in general.

What is claimed is:

1. A method of implementing a plurality of gain control modes, comprising the steps of:
    producing a high gain by
       connecting a voltage source to a first bias terminal connected through a load to an active amplifier device;
       connecting a current source to a second bias terminal of said active amplifier device; and
    producing a low gain by
       connecting said voltage source to said second bias terminal of said active amplifier device;
       connecting said current source to said first bias terminal connected through said load to said active amplifier device;
    wherein an input signal experiences a high gain when producing a high
       gain and said input signal experiences a low gain when producing
       a low gain.

2. The method of claim 1 further comprising the step of producing a high attenuation by switching off said active amplifier device.

3. The method of claim 1 further comprising the step of producing a high gain by designating said terminal of said amplifier active device connected through said load to said first bias terminal as the drain terminal.

4. The method of claim 1 further comprising the step of producing a low gain by designating said terminal of said amplifier active device connected through said load to said first bias terminal as as the source terminal.

5. The method of claim 1 wherein said voltage source is a DC voltage source.

6. The method of claim 1 wherein said active amplifier device is a transistor.

7. The method of claim 1 wherein said active amplifier device is a field effect transistor.

8. The method of claim 1 wherein said active amplifier device is a metal-oxide semiconductor field effect transistor.

9. The method of claim 1 wherein said active amplifier device is a bi-polar junction transistor.

10. The method of claim 1 wherein said current source is a constant current source.

11. The method of claim 1 wherein said current source is a resistor.

12. The method of claim 1 wherein said input signal is a radio frequency input signal.

13. The method of claim 1 wherein said load is provided by an inductor.

14. A gain controller, comprising:
   an active amplifier device together with a load having at least two bias terminals and a signal input and output;
   a voltage source connected to one of said bias terminals; and
   a current source connected to another of said bias terminals;
   wherein, when in a high gain mode, the terminal connected to said voltage source through said load is designated as the drain terminal of said active amplifier device and the terminal connected to said current source is designated as the source terminal of said active amplifier device and when in a low gain mode the terminal connected to said voltage source is designated as the drain terminal of said active amplifier device and the terminal connected to said current source through said load is designated as the source terminal of said active amplifier device.

15. The gain controller of claim 14 further comprising a power-off configuration wherein no gain is produced by said active amplifier device.

16. The gain controller of claim 14 wherein said voltage source is a DC voltage source.

17. The gain controller of claim 14 wherein said active amplifier device is a transistor.

18. The gain controller of claim 14 wherein said active amplifier device is a field effect transistor.

19. The gain controller of claim 14 wherein said active amplifier device is a metal-oxide semiconductor field effect transistor.

20. The gain controller of claim 14 wherein said active amplifier device is a bi-polar junction transistor.

21. The gain controller of claim 14 wherein said current source is a constant current source.

22. The gain controller of claim 14 wherein said input signal is a radio frequency input signal.

23. The gain controller of claim 14 wherein said load is provided by an inductor.

24. An amplifier, comprising:
   an active amplifier device;
   a radio frequency signal input connected a first pin of said active amplifier device; and
   when in a high gain mode,
      a voltage source connected through a load to a second pin of said active amplifier device;
      a current source connected to a third pin of said active amplifier device; and
      a radio frequency signal output from said second pin of said active amplifier device; and
   when in a low gain mode,
      said current source connected through said load to said second pin of said active amplifier device;
      said voltage source connected to said third pin of said active amplifier device; and
      a radio frequency signal output from said second pin of said active amplifier device.

25. The amplifier of claim 24 further comprising when in a no gain mode said current source and said voltage source are connected to said active amplifier device and biased to the same potential.

26. The amplifier of claim 24 wherein said voltage source is a DC voltage source.

27. The amplifier of claim 24 wherein said active amplifier device is a transistor.

28. The amplifier of claim 24 wherein said active amplifier device is a field effect transistor.

29. The amplifier of claim 24 wherein said active amplifier device is a metal-oxide semiconductor field effect transistor.

30. The amplifier of claim 24 wherein said active amplifier device is a bi-polar junction transistor.

31. The amplifier of claim 24 wherein said current source is a constant current source.

32. The amplifier of claim 24 wherein said first pin of said active amplifier device is a control pin.

33. The amplifier of claim 24 wherein when in high gain mode said second pin of said active amplifier device is designated as a drain terminal of said active amplifier device and third pin of said active amplifier device is designated as a source terminal of said active amplifier device.

34. The amplifier of claim 24 wherein when in low gain mode said second pin of said active amplifier device is designated as a source terminal of said active amplifier device and third pin of said active amplifier device is designated as a drain terminal of said active amplifier device.

35. The amplifier of claim 24 wherein said current source is a constant current source.

36. The amplifier of claim 24 wherein said load is provided by an inductor.

* * * * *